(12) United States Patent  
Yang

(10) Patent No.: US 9,831,301 B1
(45) Date of Patent: Nov. 28, 2017

(54) METAL RESISTOR STRUCTURES WITH NITROGEN CONTENT

(71) Applicant: INTERNATIONAL BUSINESS MACHINES CORPORATION, Armonk, NY (US)

(72) Inventor: Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/268,973

(22) Filed: Sep. 19, 2016

(51) Int. Cl.
*H01L 21/20* (2006.01)
*H01L 49/02* (2006.01)
*H01L 21/285* (2006.01)
*H01L 21/324* (2006.01)

(52) U.S. Cl.
CPC ........ *H01L 28/24* (2013.01); *H01L 21/28506* (2013.01); *H01L 21/324* (2013.01)

(58) Field of Classification Search
CPC ............. H01L 21/76856; H01L 29/518; H01L 21/28176; H01L 21/321; H01L 21/318; H01L 21/425; H01L 29/517; H01L 23/5228; H01L 27/0802; H01L 28/20; H01L 29/0649; H01L 23/5329; H01L 23/53295
See application file for complete search history.

(56) References Cited

U.S. PATENT DOCUMENTS

| 5,485,138 | A | * | 1/1996 | Morris .................. H01C 1/14 216/16 |
| 6,083,785 | A | | 7/2000 | Segawa et al. |
| 6,207,560 | B1 | | 3/2001 | Lee |
| 6,232,042 | B1 | | 5/2001 | Dunn et al. |
| 6,911,229 | B2 | | 6/2005 | Andricacos et al. |
| 2002/0073925 | A1 | * | 6/2002 | Noble .................. C23C 8/36 118/723 ME |
| 2004/0027234 | A1 | | 2/2004 | Hashimoto et al. |
| 2006/0134848 | A1 | * | 6/2006 | Lander ............. H01L 21/28079 438/216 |

* cited by examiner

*Primary Examiner* — Duy T Nguyen
(74) *Attorney, Agent, or Firm* — Cantor Colburn LLP; Louis Percello

(57) ABSTRACT

Resistor elements and methods of forming the resistor elements generally include increasing resistivity by diffusing nitrogen ions from an underlying dielectric layer into a metal resistor layer defining the resistor elements. One or more embodiments include a first resistor element and at least one additional resistor element disposed on a first dielectric material and at least one additional dielectric material, respectively, of a dielectric layer. The first dielectric material is different from the at least one additional dielectric material, and the first resistor element has a different resistivity than the at least one additional resistor element.

13 Claims, 4 Drawing Sheets

METAL RESISTOR STRUCTURES WITH NITROGEN CONTENT

BACKGROUND

The present invention generally relates to semiconductor integrated circuits, and more particularly, to the structure and formation of metal resistors with nitrogen content in the semiconductor integrated circuits.

An integrated circuit (IC) generally includes thin film (on the order of about 500 µm or less) resistors embedded in the back-end-of-the-line (BEOL) of the chip through either a damascene approach or a subtractive etch method. The resistor is one of the most common electrical components used in almost every electrical device. Efficiency of the resistor is primarily decided by its resistivity. Conventionally, doped polysilicon is used as the material of a resistor.

SUMMARY

In one or more embodiments, a method for forming a metal resistor element in a semiconductor structure includes depositing a dielectric layer formed from a first dielectric material. Nitrogen ions are deposited into an upper surface of the dielectric layer. A metal resistor layer is deposited onto the upper surface of the dielectric layer. The semiconductor structure is thermally annealed to diffuse the nitrogen ions into the metal resistor layer, and the metal resistor layer is patterned to form the metal resistor elements.

In one or more embodiments, a method for increasing resistivity of a resistor element includes depositing a dielectric layer including a first dielectric material onto a semiconductor substrate. Nitrogen ions are deposited into an upper surface of the dielectric layer. A metal resistor layer is deposited onto the dielectric, wherein the metal resistor layer including titanium, tantalum, tungsten, nitrides thereof, or alloys thereof. The semiconductor substrate is thermally annealed to diffuse the nitrogen ions in the dielectric layer into the metal resistor layer in an amount effective to increase resistivity relative to the metal resistor layer without the diffused nitrogen ion. The resistor elements are formed from the annealed metal resistor layer.

In one or more embodiments, a semiconductor structure includes a first resistor element and at least one additional resistor element disposed on a first dielectric material and at least one additional dielectric material, respectively, of a dielectric layer. The first dielectric material is different from the at least one additional dielectric material, and the first resistor element has a different resistivity than the at least one additional resistor element.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
FIG. 1 depicts a schematic cross-sectional view illustrating a semiconductor structure including a dielectric layer formed of a first dielectric material in accordance with one or more embodiments.

The detailed description explains the preferred embodiments of the invention, together with advantages and features, by way of example with reference to the drawings.

DETAILED DESCRIPTION

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures.

The same numbers in the various figures can refer to the same structural component or part thereof. The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As previously noted herein, the resistor is one of the most common electrical components used in almost every electrical device. Efficiency of the resistor is primarily decided by its resistivity. Conventionally, doped polysilicon is used as the material of a resistor. However, the conventional resistor can only provide a limited resistance within a limited dimension as the device feature size shrinks. For overcoming this problem, new materials with higher resistivity and new integration schemes are required for fabrication of thin film resistors in a highly integrated semiconductor device.

The present invention generally provides semiconductor structures including metal resistors and processes for forming the metal resistors. The structures and processes generally include a dielectric modification treatment of a dielectric surface in which the metal resistor is formed. As will be discussed in greater detail below, the dielectric modification treatment provides the dielectric surface with ionic amounts of nitrogen (N) to form a nitrogen chemically enriched surface at an interface between the dielectric layer and the metal nitride resistor as deposited. Subsequent thermal annealing results in a metal resistor structure with higher nitrogen content than the as deposited metal prior to annealing, which increases resistivity of the metal resistor. The nitrogen in the chemically enriched dielectric surface diffuses into the metal resistor during the thermal annealing process. For metal nitride resistors, the nitrogen content in the as deposited metal nitride resistor is known to be limited due to concern over potential nitrogen poisoning issues during deposition of the metal nitride. For example, the nitrogen content in tantalum nitride resistors is generally less than 50% due to potential nitrogen poison related problems. The dielectric modification treatment, as will be discussed in greater detail below, provides a mechanism for overcoming the nitrogen poison related problems so as to increase total nitrogen percentage in the resistor, thereby increasing resistivity.

Moreover, it has been found that the dielectric material can be selected to provide different levels of nitridation content, which is advantageous for providing resistors with varying resistance within the same dielectric layer. The dielectric layer of a first dielectric material can be deposited, patterned, etched and subsequently filled with at least one additional dielectric material that is different from the first dielectric material to provide the dielectric layer with regions having different dielectric materials and different percentages of nitrogen. For example, the first dielectric material can be a SiCOH dielectric and the at least one additional dielectric material can be silicon dioxide. Nitridation of SiCOH dielectrics compared to nitridation of silicon dioxide dielectrics is markedly higher under the same process conditions. The percent nitrogen in the SiCOH dielectric surface has generally been found to be about 2 to about 10% compared to about 0.5 to about 1.5% in the surface of the silicon dioxide dielectric under similar nitridation treatment processes.

Reference is now made to FIGS. 1-8, which are pictorial representations (through cross sectional views) depicting the basic processing steps and the resulting semiconductor structure employed in one or more embodiments of the present invention. Specifically, the inventive method begins with providing a semiconductor structure 10 with a dielectric layer 12 formed of a first dielectric material 14 as shown in FIG. 1, which, for example, can be a dielectric capping layer used to separate interconnect levels.

Suitable dielectric materials 14 for forming the dielectric layer 12 therein are not intended to be limited and can include inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organo silicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer can be deposited by PECVD, spin-on or other procedures as is generally known in the art.

Figure 2:
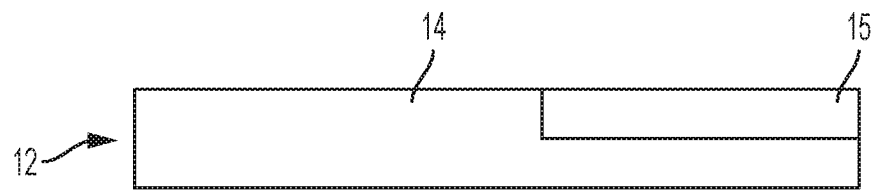
FIG. 2 depicts a schematic cross-sectional view illustrating the semiconductor structure after formation of a second dielectric material in the dielectric layer, wherein the first and second dielectric materials are different.

Referring now to FIG. 2, in one or more optional embodiments, the dielectric layer 12 of the first dielectric material 14 can be lithographically patterned, and etched to form one or more additional dielectric regions of a different dielectric material 15 within the dielectric layer 12.

By way of example, the first dielectric material 14 can be selected from the group consisting of silsequioxanes, carbon doped oxides that include atoms of Si, C, O, and H, SiCOH, SiLK, and the like. The additional dielectric material 15 can be silicon dioxide, tetraorthosilicate (TEOS), or the like. The thickness of the dielectric layer is not intended to be limited and the additional dielectric material 15 can be of equal thickness or unequal thickness to the first dielectric material 14.

Figure 3:
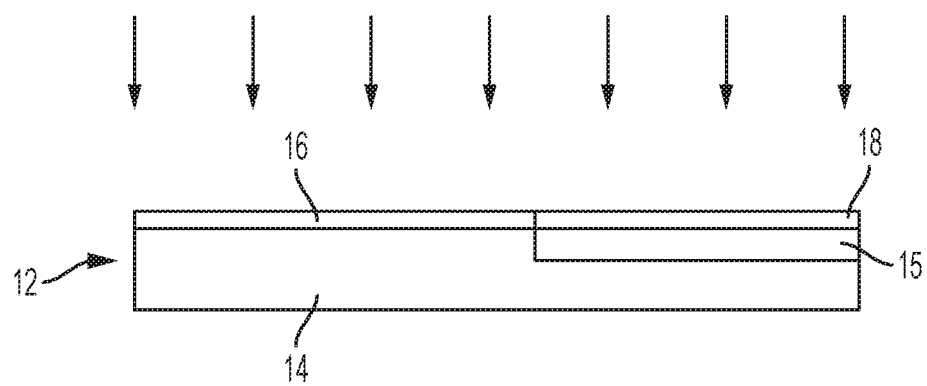
FIG. 3 depicts a schematic cross-sectional view illustrating the semiconductor structure after nitridation of the dielectric layer surface according to one or more embodiments.

In FIG. 3, the dielectric layer 12 including the first dielectric material 14 and the optional dielectric material(s) 15 therein are subjected to a nitridation process to form a nitrogen chemically enriched surface. In this step, the dielectric surfaces are exposed to nitrogen ions generated from a nitrogen-containing gas to nitrogen enrich the dielectric surface. As defined herein, the nitrogen-containing gas is selected from the group consisting of nitrogen ($N_2$) and ammonia ($NH_3$). Upon exposure to a suitable energy source, the nitrogen or ammonia dissociates to form nitrogen ions, which are then utilized to enrich a contact surface such as the exposed surfaces of the dielectric layer with nitrogen ions. Suitable energy sources include, but are not limited to, plasma energy sources and thermal energy sources.

Plasma nitridization generally includes exposing the nitrogen-containing gas to a plasma energy source effective to generate the nitrogen ions from the nitrogen containing gas. The substrate including the exposed dielectric layer surfaces of the trench and via are then exposed to the nitrogen ions to form a nitrogen enriched surface that also penetrates the respective surface to form a nitrogen enriched gradient in the dielectric layer. The process temperature is between 80 to 400° C., and the bias is typically between 100 to 900 W.

Thermal nitridization provides a similar effect as plasma nitridization but generally includes exposing the substrate to a temperature effective to generate nitrogen ions from the nitrogen containing gas. Again, the nitrogen ions contact and penetrate the exposed surface of the dielectric layer so as to form a nitrogen enriched gradient in the dielectric layer. The process temperature is generally between 200 to 400° C.

A plasma treatment is then performed to clean the exposed copper metal surface 60 at the bottom of the via of contaminants, oxides, nitrides, or the like. The process gases preferably include, but are not limited to, $H_2$, forming gas, $O_2$ and combinations thereof and a carrier gas. The carrier gases preferably include inert gases, He, Ne, Ar, Kr, Xe and Rn, and combinations thereof. The process conditions preferably include a temperature of between about room temperature and about 450° C., a pressure of between about 0.5 mtorr and about 100 torr, an RF power of between about 50 W and about 5 KW, and a process time of between about 5 seconds and about 600 seconds.

The penetration depth of the nitrogen ions into the exposed dielectric surface is generally less than about 10 Angstroms in one or more embodiments, less than about 5 Angstroms in one or more other embodiments, and from about 1 Angstrom to less than 3 Angstroms in still one or more other embodiments. In one or more embodiments, the percentage of nitrogen within the penetration depth is generally greater than 0.1% to less than 20% by atomic percentage of the dielectric layer within the penetration depth. In one or more other embodiments, the percentage of nitrogen within the penetration depth is generally greater than 0.5% to less than 10% by atomic percentage of the dielectric layer within the penetration depth. As noted above, the particular dielectric material affects the amount of ionic nitrogen penetrated into the dielectric layer. For example, dielectric materials such as silsequioxane, carbon doped oxides, e.g., organosilicate that include atoms of Si, C, O, and H, SiCOH, SiLK, or the like can provide higher ionic nitrogen concentrations of than dielectric materials such as silicon dioxide, tetraorthosilicate (TEOS), or the like under similar nitridation processing conditions. For example, silsequioxane and like dielectric materials can have a nitrogen percentage of about 2 to about 10% compared to silicon dioxide and like dielectric materials at about 0.5 to about 1.5% under similar nitridation treatment conditions. This provides another tool to the end user to provide metal resistors with different resistivities as can be desired for some devices.

As shown if FIG. 3, the dielectric layer 12 included two different dielectric materials 14, 15, leading to formation of a first nitrogen enriched region 16, and an additional nitrogen enriched region 18, respectively, wherein the percentages of nitrogen in each respective region is different.

By way of example, the first dielectric material 14 can be a silsequioxane and the corresponding dielectric region 16 can have a percentage of nitrogen greater than 2 percent to 10 percent at/in the surface whereas the at least one additional dielectric material 15 can be silicon dioxide and the corresponding dielectric region 18 have a percentage of nitrogen from 0.5 to about 1.5 percent. The number of dielectric regions in the first dielectric layer 12 is not intended to be limited and can vary from none to as many as is desired.

Figure 4:
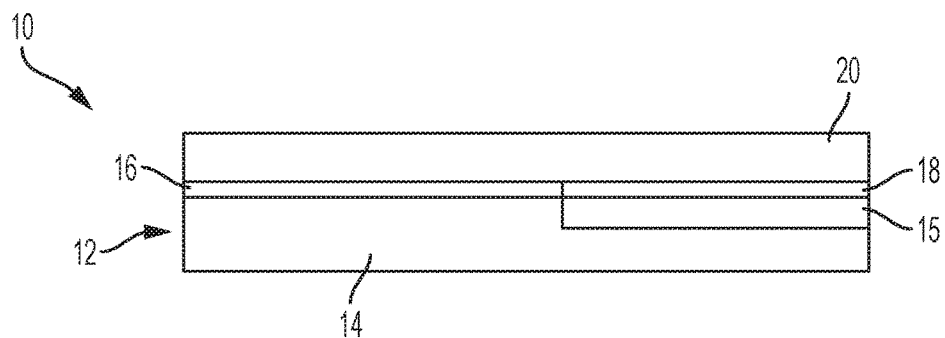
FIG. 4 depicts a schematic cross-sectional view illustrating the semiconductor structure of FIG. 2 after deposition of a metal layer.

In FIG. 4, a resistor metal layer 20 is deposited onto the dielectric layer 12. The resistor metal layer can be a metal such as titanium, tungsten, tantalum, nitrides thereof, alloys thereof, and the like. The resistor metal layer 20 can be deposited using by plasma vapor deposition (PVD), chemical vapor deposition (CVD), atomic layer deposition (ALD), or other procedures as is generally known in the art. The thickness of the resistor metal layer is not intended to be limited and is generally between 250 Angstroms and 5000 Angstroms.

Figure 5:
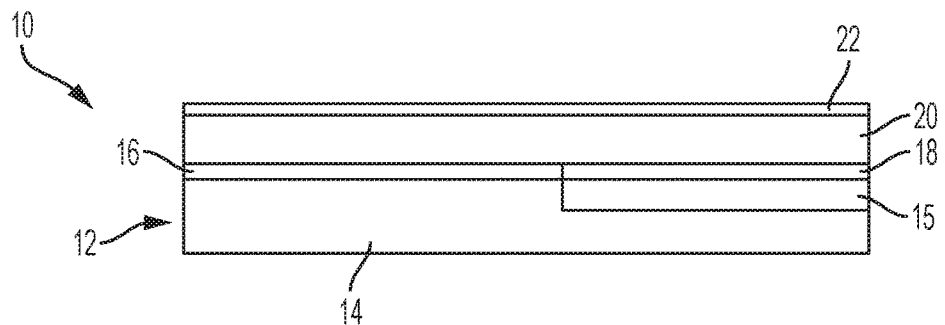
FIG. 5 depicts a schematic cross-sectional view illustrating the semiconductor structure of FIG. 2 after deposition of a capping layer overlying the metal layer according to one or more embodiments.

In FIG. 5, a capping layer 22 is formed on the resistor metal layer 20. The capping layer can be silicon nitride, carbide, oxide, Si(N, H, O) or the like. The thickness of the resistor metal layer is not intended to be limited and is generally between 1 nm and 80 nm. The capping layer 22 protects the underlying resistor metal 20 from oxidation, humidity, and contamination during subsequent processing. Additionally, capping layer 22 serves to prevent undesirable diffusion of the underlying resistor metal into other layers such as an interlayer dielectric. Exemplary capping materials include silicon nitride, silicon carbide, silicon oxycarbide, hydrogenated silicon carbide, silicon dioxide, organosilicate glass, nitrogen, hydrogen, and/or oxygen doped silicon carbide, and other low-k dielectrics.

Figure 6:
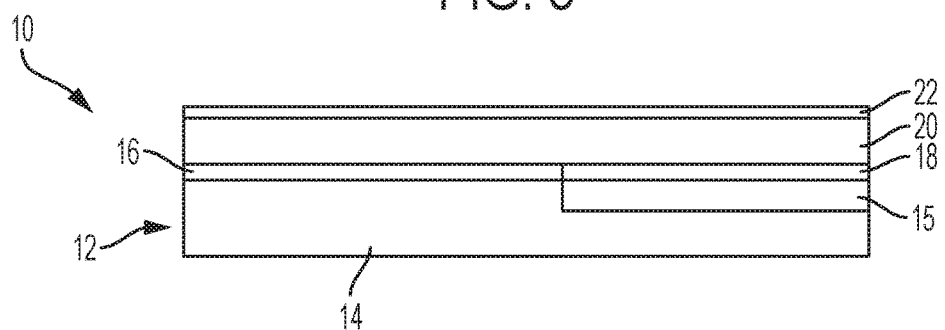
FIG. 6 depicts a schematic cross-sectional view illustrating the semiconductor structure after a thermal annealing process according to one or more embodiments.

In FIG. 6, the semiconductor substrate 10 is then subjected to a thermal annealing process, which improves various properties of the metal resistor such as providing an increased resistivity due to thermal diffusion of the nitrogen from the underlying dielectric layer 12 into the metal resistor layer 20. Moreover, in one or more embodiments, utilizing more than one dielectric material to define the dielectric layer 12 provides the resistor metal with location dependent resistivities. By way of example, a tantalum nitride resistor layer overlying nitrogen enriched dielectric region 18 formed of silsequioxane can have a nitrogen content of 2 percent to about 10 percent or greater so as to provide a resistivity of 400 μΩ-cm to 800 μΩ-cm whereas dielectric region 16 formed of silicon dioxide with a lower nitrogen content of 0.5 to 1.5% nitrogen can have a lower resistivity of 150 μΩ-cm to 400 μΩ-cm.

The annealing process generally includes heating the substrate at an elevated temperature in an inert atmosphere for a defined period of time. Exemplary annealing processes include furnace anneal, laser anneal, or the like. The furnace anneal generally includes heating the semiconductor structure 10 at a temperature within a range from 100° C. to 500° C. for a period of time of 20 minutes to 4 hours. Laser annealing can generally be at a temperature within a range for 400° C. to 900° C. for a period of time of 10 nanoseconds to 5 minutes. Ovens, furnaces, rapid thermal processing equipment and the like can be utilized for the annealing process.

Figure 7:
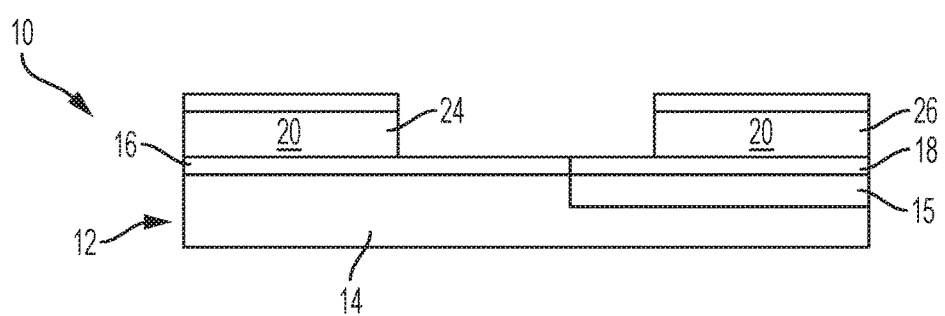
FIG. 7 depicts a schematic cross-sectional view illustrating the semiconductor structure after photolithographic patterning and etching according to one or more embodiments.

Following the annealing process, different resistor elements are lithographically patterned and etched to form a first resistor 24 and at least one additional resistor 25 as shown in FIG. 7. Depending on whether the dielectric layer 12 is formed of the first dielectric material in its entirety or is configured with different dielectric materials the resistivity for the different resistor elements can be the same or vary by diffusion nitrogen therein.

Figure 8:
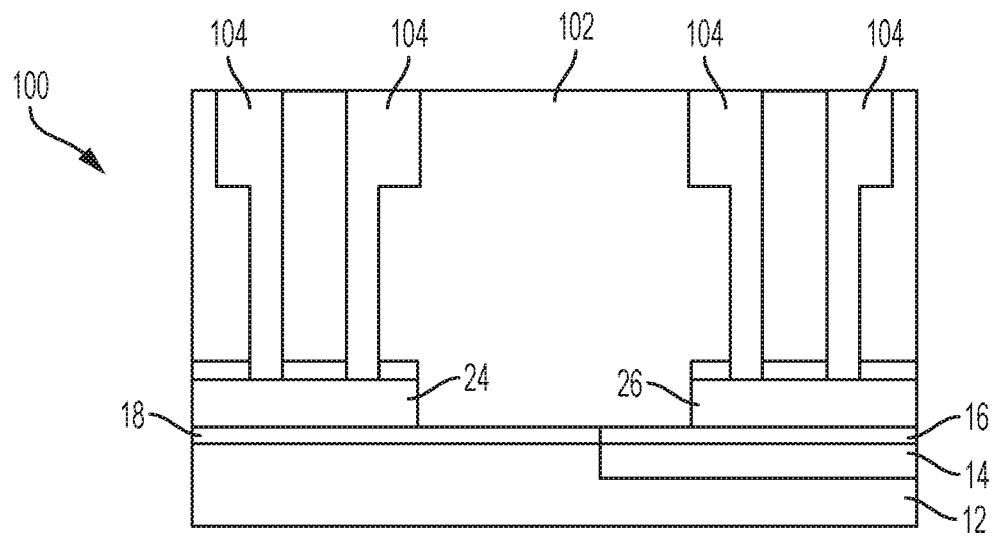
FIG. 8 depicts a schematic cross-sectional view illustrating the semiconductor structure subsequent to deposition of an interlayer dielectric and formation of an interconnect structure according to one or more embodiments.

Turning now to FIG. 8, there is an exemplary semiconductor structure 100 including interconnect structures overlying the resistors regions 24, 26 as previously formed. First, an interlayer dielectric 102 is formed overlying the semiconductor substrate 10. The interlayer dielectric 102 can be one of a number of different dielectric materials commonly used in integrated circuit fabrication. For example, interlayer dielectric 102 can be silicon dioxide, silicon nitride, or a doped glass layer, such as phosphorus silicate glass, boron silicate glass, and the like. In other embodiments, the interlayer dielectric 102 can be a low k dielectric layer, wherein low k generally refers to materials having a dielectric constant less than silicon dioxide. Exemplary low k dielectric materials include, without limitation, SiLK® from Dow Chemical, Coral® from Novellus, Black Diamond® from Applied Materials, and spin on dielectrics can be used. Coral® can be described generically as a SiCOH dielectric. Depending upon the particular dielectric material, interlayer dielectric 102 can be formed by chemical vapor deposition deposited (CVD), plasma enhanced chemical vapor deposition (PECVD), atmospheric deposition as well as spin on techniques.

Once the interlayer dielectric 102 has been deposited, openings such as trench and/or via features are next photolithographically patterned into the dielectric layer 102. Photolithography can include forming a photoresist onto the interlayer dielectric surfaces where openings are desired, exposing the photoresist to a pattern of activating radiation, and then developing the exposed photoresist with a resist developer to provide a patterned photoresist. At least one etch process can be employed to transfer the pattern from the patterned photoresist into the interlayer dielectric 102 and form the opening. The etching process can be a dry etch (e.g., reactive ion etching, plasma etching, ion beam etching, or laser ablation) and/or a wet chemical etch (e.g., potassium hydroxide (KOH)). After transferring the pattern, the patterned photoresist is removed utilizing resist stripping processes, for example, ashing.

A metal liner layer, i.e., barrier layer, is then deposited onto the patterned dielectric layer. For example, tantalum, tantalum nitride, cobalt, ruthenium, titanium nitride, and combinations of more than one material (for example tantalum nitride/tantalum or tantalum nitride/cobalt). The presence of the barrier layer such as titanium nitride, for example, insures that copper, participating in the interdiffusion during subsequent annealing processes, will not further diffuse into underlying dielectric layers.

Next, an optional seed layer is deposited. The function of the seed layer is to provide a base upon which a copper conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering. In the case of a dual damascene process, the seed layer can be deposited on an underlayer disposed in a via within the dielectric material.

The composition of the one or metals in the deposited seed layer is typically from 1 atomic percent to 10 atomic percent. In some embodiments, the deposited seed layer will contain from 1 atomic percent to 7 atomic percent. Examples of seed layers are copper, copper manganese, and the like.

Following deposition of the seed layer, a layer of copper is then deposited. With regard to some structures, the copper metal layer can include an alloying element such as C, N, O, Cl or S, which have been shown to improve the reliability of the copper conductor. The amount of alloying element in the copper alloy is typically in the range of about 0.001 weight percent (wt. %) to about 10 wt %.

The copper layer can be formed by CVD, sputtering, electrochemical deposition or like processes. For example, the deposition of copper can proceed by electrochemical deposition such as electroplating or electroless plating. Examples of suitable copper electroplating compositions are described in U.S. Pat. No. 6,911,229 assigned to International Business Machines Corporation, the entire description of which is incorporated by reference in its entirety.

Following formation of copper metal layer, the substrate 100 is subjected to a planarization process to remove the copper overburden such that a top surface of the copper is substantially coplanar to the low k dielectric layer and form the damascene structure. For example, the surface can be planarized using an electropolishing process. In an electropolishing process small amounts of copper are etched from the copper by electroetch or electrochemical etching to provide a copper interconnect having a top copper surface generally coplanar to the top surface of the interlayer dielectric. In another embodiment, the planar surface is formed by chemical-mechanical-polishing (CMP), using a non-selective slurry composition. The slurry composition contains a silica abrasive material, which removes the different metal layers at substantially the same rate. Alternatively, a planar surface can be formed by a non-selective plasma etching process. The plasma etching process can include additional planarizing layers deposited onto copper layer. For example, a layer of photoresist can be deposited onto copper layer prior to performing the non-selective etch process. The copper metal 104 fills the via and trench feature to form the interconnect structure.

Figure 9:
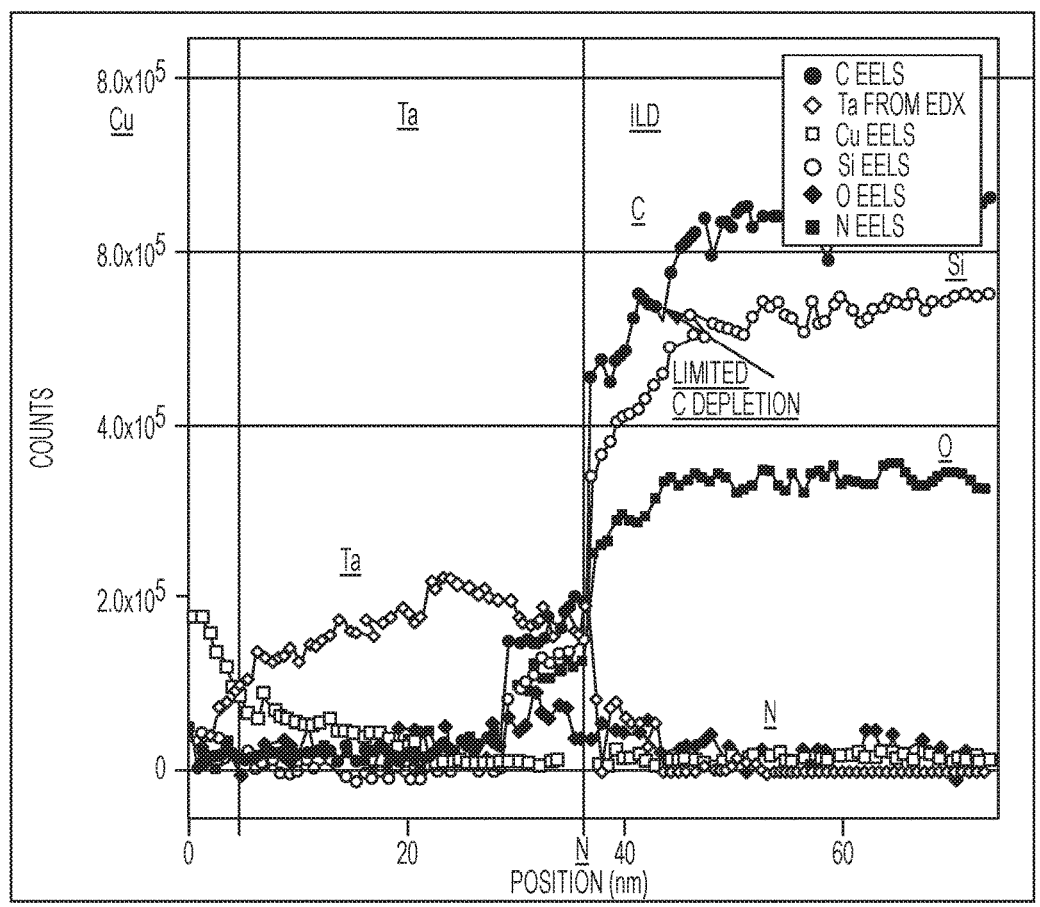
FIG. 9 graphically illustrates EDX/EELS profile for a post-anneal tantalum resistor structure formed on a nitrogen enriched interlayer dielectric.

FIG. 9 graphically illustrates EDX/EELS profile for a post-anneal tantalum resistor structure formed on a nitrogen enriched interlayer dielectric. As shown, nitrogen as measured by EELS diffused into the tantalum metal layer as measured by EDX, which advantageously increased resistivity of the tantalum layer.

All ranges described herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the present invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly described otherwise or otherwise impossible as would be known to one of ordinary skill in the art. Accordingly, the present invention is intended to encompass all such alternatives, modifications and variations which fall within the scope and spirit of the present invention and the following claims.

What is claimed is:

1. A method for forming a metal resistor elements in a semiconductor structure, the method comprising:
   depositing a dielectric layer comprising a first dielectric material and at least one additional dielectric material, wherein the first dielectric material and the at least one additional dielectric material are different;
   depositing nitrogen ions into an upper surface of the dielectric layer, wherein subsequent to depositing the nitrogen ions the first dielectric material has a percentage of the nitrogen ions at a penetration depth between 2 percent and 10 percent and the at least one additional material dielectric layer has a percentage of nitrogen ions at the penetration depth between 0.5 percent and 1.5 percent;

depositing a metal resistor layer onto the upper surface of the dielectric layer;

thermally annealing the semiconductor structure to diffuse the nitrogen ions into the metal resistor layer from the dielectric layer; and patterning the metal resistor layer to form the metal resistor elements.

2. The method of claim 1, further comprising depositing a capping layer onto the metal resistor layer prior to thermally annealing the semiconductor structure.

3. The method of claim 2, wherein the capping layer comprises silicon nitride, silicon dioxide, silicon carbide, or nitrogen, hydrogen, and/or oxygen doped silicon carbide.

4. The method of claim 1, wherein the metal resistor layer comprises titanium, tantalum, tungsten, nitrides thereof, or combinations thereof.

5. The method of claim 1, wherein the resistor elements overlying the first dielectric material has a resistivity of 150 µΩ-cm to 400 µΩ-cm and the resistor elements overlying the at least one additional dielectric material has a resistivity of 400 µΩ-cm to 800 µΩ-cm.

6. The method of claim 1, wherein the first dielectric material comprises a silsesquioxane or a carbon doped oxide including atoms of Si, C, O and H, and the at least one additional dielectric layer comprises a silicon dioxide or tetraorthosilicate.

7. The method of claim 1, wherein depositing the nitrogen ions into the upper surface of the dielectric layer comprises exposing a nitrogen containing gas to plasma to generate the ions.

8. The method of claim 1, wherein depositing the nitrogen ions into the upper surface of the dielectric layer is at penetration depth of less than about 10 Angstroms.

9. The method of claim 1, wherein depositing the nitrogen ions into the upper surface of the dielectric layer is at penetration depth of less than about 5 Angstroms.

10. The method of claim 1, wherein depositing the nitrogen ions into the upper surface of the dielectric layer is at penetration depth of less than about 1 to about 3 Angstroms.

11. A method for increasing resistivity of a resistor element, the method comprising:

depositing a dielectric layer onto a semiconductor substrate comprising a first dielectric material and at least one additional dielectric material, wherein the first dielectric material and the at least one additional dielectric material are different;

depositing nitrogen ions into an upper surface of the dielectric layer, wherein subsequent to depositing the nitrogen ions the first dielectric material has a percentage of the nitrogen ions at a penetration depth between 2 percent and 10 percent and the at least one additional material dielectric layer has a percentage of nitrogen ions at the penetration depth between 0.5 percent and 1.5 percent;

depositing a metal resistor layer onto the dielectric layer comprising titanium, tantalum, tungsten, nitrides thereof, or alloys thereof;

thermally annealing the semiconductor substrate to diffuse the nitrogen ions in the dielectric layer into the metal resistor layer in an amount effective to increase resistivity relative to the metal resistor layer without the diffused nitrogen ions; and forming resistor elements from the annealed metal resistor layer.

12. The method of claim 11, wherein depositing the nitrogen ions into the upper surface of the dielectric layer is at penetration depth of less than about 10 Angstroms.

13. The method of claim 11, wherein the dielectric layer comprises silsequioxane, carbon doped oxides, organosilicates that include atoms of silicon, carbon, oxygen and hydrogen, SiCOH, silicon dioxide, and/or tetraorthosilicate.

* * * * *